(12) United States Patent
Somervell et al.

(10) Patent No.: US 10,170,354 B2
(45) Date of Patent: Jan. 1, 2019

(54) SUBTRACTIVE METHODS FOR CREATING DIELECTRIC ISOLATION STRUCTURES WITHIN OPEN FEATURES

(71) Applicant: Tokyo Electron Limited, Tokyo (JP)

(72) Inventors: Mark H. Somervell, Austin, TX (US); Benjamen M. Rathsack, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 38 days.

(21) Appl. No.: 15/096,314

(22) Filed: Apr. 12, 2016

(65) Prior Publication Data

US 2016/0300756 A1 Oct. 13, 2016

Related U.S. Application Data

(60) Provisional application No. 62/146,386, filed on Apr. 12, 2015.

(51) Int. Cl.

| H01L 21/02 | (2006.01) |
|---|---|
| H01L 21/31 | (2006.01) |
| H01L 21/762 | (2006.01) |
| H01L 21/027 | (2006.01) |
| H01L 21/3105 | (2006.01) |
| H01L 21/311 | (2006.01) |

(52) U.S. Cl.
CPC .... *H01L 21/76224* (2013.01); *H01L 21/0273* (2013.01); *H01L 21/02164* (2013.01); *H01L 21/02178* (2013.01); *H01L 21/02186* (2013.01); *H01L 21/02238* (2013.01); *H01L 21/02244* (2013.01); *H01L 21/31058* (2013.01); *H01L 21/31122* (2013.01); *H01L 21/31133* (2013.01)

(58) Field of Classification Search
CPC .................................................. H01L 21/02244
USPC .......................................................... 438/400
See application file for complete search history.

(56) References Cited

U.S. PATENT DOCUMENTS

| 2002/0151177 A1* | 10/2002 | Cherian ............ H01L 21/31053 438/691 |
| 2005/0272220 A1* | 12/2005 | Waldfried ......... H01L 21/02126 438/400 |
| 2012/0276714 A1* | 11/2012 | Shih .................. H01L 21/02164 438/435 |
| 2013/0228923 A1* | 9/2013 | Kolics ............... H01L 23/53238 257/751 |

(Continued)

*Primary Examiner* — Moazzam Hossain
*Assistant Examiner* — Omar Mojaddedi
(74) *Attorney, Agent, or Firm* — Wood Herron & Evans LLP

(57) ABSTRACT

A method for partially filling an open feature on a substrate includes receiving a substrate having a layer with at least one open feature formed therein, wherein the open feature penetrates into the layer from an upper surface and includes sidewalls extending to a bottom of the open feature. The open feature is overfilled with an organic coating that covers the upper surface of the layer and extends to the bottom of the open feature. The method further includes removing a portion of the organic coating to expose the upper surface of the layer and recessing the organic coating to a pre-determined depth from the upper surface to create an organic coating plug of pre-determined thickness at the bottom of the open feature, and converting the chemical composition of the organic coating plug to create an inorganic plug.

17 Claims, 7 Drawing Sheets

(56) References Cited

U.S. PATENT DOCUMENTS

| | | | | |
|---|---|---|---|---|
| 2013/0309871 A1* | 11/2013 | DeVilliers | ........... | H01L 21/0273 |
| | | | | 438/703 |
| 2015/0225850 A1* | 8/2015 | Arora | ................ | C23C 16/45525 |
| | | | | 216/51 |
| 2015/0280129 A1* | 10/2015 | Kim | .................... | H01L 51/0097 |
| | | | | 257/40 |
| 2015/0294984 A1* | 10/2015 | Cheng | ................. | H01L 27/1203 |
| | | | | 257/347 |
| 2016/0133497 A1* | 5/2016 | Andry | ................ | H01L 21/6835 |
| | | | | 156/712 |

* cited by examiner

SUBTRACTIVE METHODS FOR CREATING DIELECTRIC ISOLATION STRUCTURES WITHIN OPEN FEATURES

CROSS-REFERENCE TO RELATED APPLICATIONS

This application is related and claims priority to U.S. Provisional Patent Application Ser. No. 62/146,386 filed on Apr. 12, 2015, the entire contents of which are herein incorporated by reference.

FIELD OF INVENTION

The invention relates to methods for partially filling an open feature on a substrate, and in particular, to methods for forming a dielectric plug at the bottom of the open feature in a semiconductor device.

DESCRIPTION OF RELATED ART

The need to remain competitive in cost and performance in the production of semiconductor devices elevates demand to continually increase the device density of integrated circuits. And, to achieve higher degrees of integration with the miniaturization in semiconductor integrated circuitry, robust methodologies are required to reduce the scale of the circuit pattern formed on the semiconductor substrate. These trends and requirements impose ever-increasing challenges on the ability to prepare electrical structure isolation during circuit pattern fabrication.

Photolithography is a mainstay technique used to manufacture semiconductor integrated circuitry by transferring geometric shapes and patterns on a mask to the surface of a semiconductor wafer. In principle, a light sensitive material is exposed to patterned light to alter its solubility in a developing solution. Once imaged and developed, the portion of the light sensitive material that is soluble in the developing chemistry is removed, and the circuit pattern remains. Furthermore, to advance optical lithography, as well as accommodate the deficiencies thereof, continual strides are being made to establish alternative patterning strategies to equip the semiconductor manufacturing industry for sub-30 nm technology nodes.

One type of circuit pattern includes trenches etched into a substrate, e.g., a silicon substrate, such that a plurality of fins composed of the substrate material extend from the bottom of the trenches. Traditionally, these trenches were filled with a dielectric material, through various methods, to minimize the undesirable transfer of current between adjacent fins. This transfer of current occurs through processes such as leakage. The dielectric material was meant to insulate the space between adjacent fins, thus decreasing the flow of electrons and holes therebetween. The fins were typically of uniform height.

When adding the dielectric material, various methods were used to ensure that the dielectric material filled the trenches to the top of adjacent fins and maintained a relatively planar surface over the face of the semiconductor chip. In each method, however, the dielectric material was directly applied to the surface. A plurality of metal gates could then be placed over the surface so that a conducting channel was formed in the silicon region, i.e., the top of the fin, when in the "on" state.

However, as the size of integrated circuits became smaller, the planar engagement of the metal gate with the silicon region led to unsatisfactory performance of the chip. In response to this unsatisfactory performance, three-dimensional transistors were developed, in which the dielectric material did not extend to the top of the trench, thereby exposing three surfaces of the silicon fin. A metal gate was then placed over the fin, making contact with all three exposed surfaces, so that conducting channels formed on all three sides of the fin.

Nonetheless, partially filling an open feature, such as the trenches described above, with a typical dielectric material, such as an oxide material, is difficult. Therefore, there is a need for methods for selectively filing only a portion of an open feature of a semiconductor device with a dielectric material.

SUMMARY OF THE INVENTION

Embodiments of the invention relate to a method for partially filling an open feature on a substrate, and in particular, a method for forming a dielectric plug at the bottom of the open feature.

According to one embodiment, a method for partially filling an open feature on a substrate includes receiving a substrate having a layer with at least one open feature formed therein, wherein the open feature penetrates into the layer from an upper surface and includes sidewalls extending to a bottom of the open feature. The open feature is overfilled with an organic coating that covers the upper surface of the layer and extends to the bottom of the open feature. The method further includes removing a portion of the organic coating to expose the upper surface of the layer and recessing the organic coating to a pre-determined depth from the upper surface to create an organic coating plug of pre-determined thickness at the bottom of the open feature, and converting the chemical composition of the organic coating plug to create an inorganic plug.

DETAILED DESCRIPTION OF SEVERAL EMBODIMENTS

Figure 1:
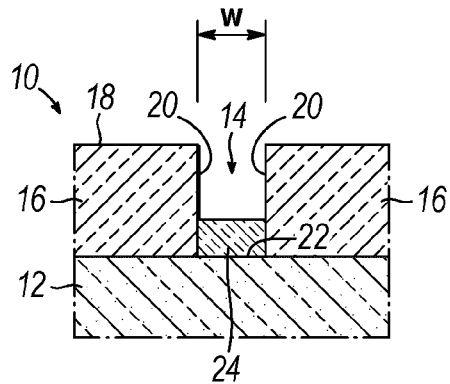
FIG. 1 provides a schematic representation of an open feature within which a material is to be formed to partially fill the open feature.

In the following description, for purposes of explanation and not limitation, specific details are set forth, such as a particular process flow for a processing system or collection of systems. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without these specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation, unless stated otherwise. Operations described may be performed in a different order than the described embodiment. Various additional operations may be performed, and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure, such as a thin film. The substrate may be a conventional silicon substrate or other bulk substrate comprising a layer of semi-conductive material. As used herein, the term "bulk substrate" includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, the substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As noted above, advanced methodologies are required to partially fill an open feature, such as a trench or via/hole, with a dielectric material. The dielectric can fill the bottom of the trench or via/hole, and can be formed to contact the sidewalls imposed by the confining structure, for example, up to at least the top of the dielectric itself. The dielectric material can be selected to be thermally resistant, and meet a pre-determined electrical requirement, e.g., provide electrical isolation of one electrical structure relative to another. Furthermore, among other things, the methods described herein can reduce or minimize damage to the open feature and surrounding structure by the inclusion of the dielectric material.

Therefore, according to various embodiments, a subtractive method is described based on filling the open feature with an organic material, which is capable of filling features of relatively small critical dimension (CD) and/or high aspect ratio without voids or substantially without voids, removing a portion of the organic material from the open feature, and then converting the remaining organic material into a dielectric material through various reactive mechanisms. FIG. 1 is a diagrammatic illustration of a portion of an exemplary semiconductor device formed by the inventive methodologies. Semiconductor device 10 includes substrate 12 and an open feature, particularly a trench 14, formed in a material layer 16 having an upper surface 18. Trench 14 is defined by sidewalls 20 that are separated by width W and extend to a bottom 22 of the trench 14. A dielectric plug 24 is formed at the bottom 22 of the trench 14.

Several embodiments describe the process flows that can yield the desired dielectric structure within an open feature, such as a trench or via. A brief summary of exemplary process flows are outlined below, and include the following: (i) coat (overfill) the feature; (ii) recess the material into feature; and (iii) convert to a dielectric material within the feature.

Scheme A
  a) Coat with polymeric material containing a carbonyl functionality
  b) Expose material to UV light to break chemical bonds
  c) Rinse away decomposed organic material with solvent
  d) Incorporate aluminum atoms into matrix
  e) Remove remaining organic material and create aluminum oxide dielectric Scheme B
  a) Coat with a polymeric material containing low acidic —OH functionality
  b) Rinse away a portion of the organic material with standard developer
  c) Silylate —OH functionality
  d) Remove remaining organic material and oxidize silicon to make $SiO_2$ dielectric Scheme C
  a) Coat with spin-on-carbon film
  b) Use UV ozone process to etch back polymer
  c) Infiltrate with source of metallic atoms Scheme D
  a) Coat trenched semiconductor with photoactive film
  b) Flood exposure where wavelength of light prevents penetration into the trenches
  c) Over-coat with acid-containing film
  d) Diffusion bake to drive acid into material
  e) Develop with a timed develop step Several embodiments describe methods for forming a dielectric plug at the bottom of a trench, as shown in FIG. 1. The materials that constitute the bottom of the trench may be the same or different in each embodiment, and the dielectric material forming the plug may be meant to fill only a small part of the trench. As noted earlier, this dielectric material may electrically isolate two electrically active structures, while being capable of withstanding a considerable thermal profile. As this dielectric material is formed, the process flow may be selected to minimize damage to the sidewalls or bottom of the existing structure.

In several embodiments, a track system can be used to perform the subtractive methods described herein. Track systems, including coater and developer systems, include modules capable of spin coating materials onto a substrate, thermally treating materials on the substrate, and chemically treating the materials on the substrate. Track systems are commercially available from Tokyo Electron Limited. One technique to create a dielectric plug is to fill the open feature with a spin-on dielectric, and then, using an etch back process, either wet or dry, the dielectric material can be recessed into the feature. However, this process is difficult in practice.

Therefore, in accordance with embodiments described herein, the process sequences include over-filling the trenches with an organic material, etching back to recess the material within the open feature, and then converting the organic material into a dielectric material.

Figure 2A:
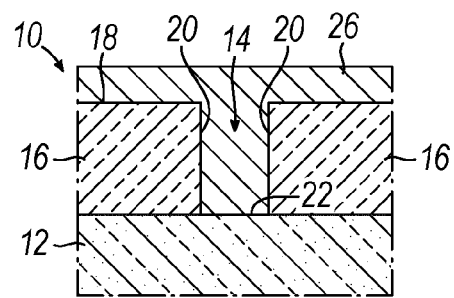
FIGS. 2A-2E illustrate an exemplary method according to an embodiment.

Turning now to the figures, FIGS. 2A-2E provide a schematic diagram of an exemplary process in accordance with an embodiment. As shown in FIG. 2A, an organic coating 26 is deposited on the substrate 12 in such a way that trench 14 is overfilled. A polymer such as poly(methyl methacrylate) (PMMA), for example, may be used for the organic material. PMMA as the organic coating 26 exhibits favorable gap-filling characteristics, and thus, can be used to fill open features with a small width W and/or high aspect ratio such that the PMMA fully extends to the bottom 22 of the trench 14 and covers the upper surface 18. Further, PMMA can be formulated with a wide range of molecular weight, and at reduced molecular weight, gap-filling performance improves.

Figure 2B:
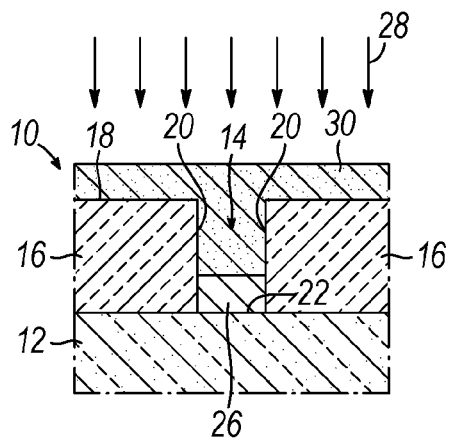

After the organic coating 26 is formed, it is exposed to electromagnetic radiation 28 such as ultraviolet (UV) light, as shown in FIG. 2B, to modify a portion of the organic coating 26, including the portion that covers the upper surface 18 and extending to a pre-determined depth in the trench 14 to form a modified portion 30. When low molecular weight (or oligomeric) PMMA is used for organic coating 26, for example, UV exposure may be desirable. UV light can break the bonds of the PMMA backbone, making the modified portion 30 a decomposition product that is soluble in organic solvents.

Depending on the size of the open features, and the wavelength of light used, the optical properties of the organic coating 26 may be matched to the optical properties of the surrounding structure of material layer 16, such as the trench or via sidewall 20, so that low wavelength of light can penetrate the structure. For example, UV light with a wavelength ranging from approximately 170 nm to approximately 180 nm, such as 172 nm light, can be used to effectively penetrate openings of width W that are quarter wavelength (43 nm) or greater. However, if the optical properties of the organic coating 26 are made to match the optical properties of the surrounding structure of material layer 16 through addition of a small amount (i.e., low concentration) of a dye, then the coated structure will appear to the exposing wavelength to be a more optically homogeneous material and penetrate deeper into the open features. Thus, the addition of an appropriate dye may be used to tailor the depth of penetration of the light and, as a result, the height of the dielectric plug 24 (FIG. 1) within the open feature of the semiconductor device 10.

Figure 2C:
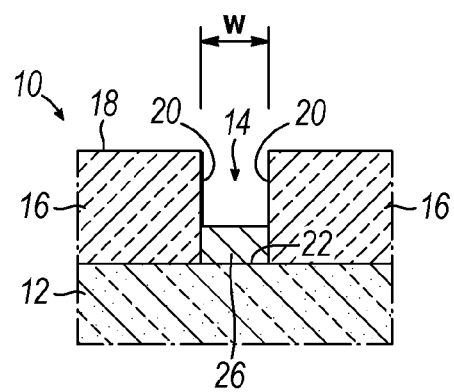

Once the exposure has occurred, the organic coating 26 is recessed into the trench 14 through wet development with an organic solvent such as an alcohol or organic acid, to remove the modified portion 30, as shown in FIG. 2C. In certain embodiments, isopropyl alcohol (IPA) or acetic acid can be used. In the same or different embodiments, developers commonly associated with positive tone resists may be used. Alternatively, developers commonly associated with negative tone resists may also be used. The etch rate of the modified portion 30 can depend on the amount of UV exposure used. Also, the amount of UV exposure can control the molecular weight of the PMMA polymer remaining in the open feature, i.e., the unmodified portion of organic coating 26 at the bottom 22 of trench 14. Therefore, the molecular weight and amount of the unmodified portion of the organic coating 26 remaining may be controlled by tailoring the etch rate and carefully monitoring the time of UV exposure.

Figure 2D:
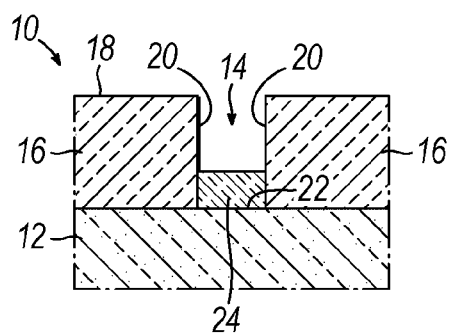

Following the etch-back of the organic coating 26, the remaining material is converted into an inorganic material, in particular a dielectric to form dielectric plug 24, as shown in FIG. 2D. PMMA, for example, is known to undergo aluminum sequential infiltration synthesis (SIS) through the carbonyl group in the methacrylate moiety, thus allowing aluminum atoms to be incorporated into the organic material. The SIS process is self-propagating, i.e., subsequent cycles of the SIS processing lead to subsequent incorporation of aluminum into the film. Following the SIS step, the organic material can be removed, and the aluminum can be converted to a viable aluminum oxide dielectric material as dielectric plug 24.

Conversion can be accomplished through a number of known oxidation mechanisms. In one example, oxidation can be performed by thermally baking at high temperature to "burn" the organic. In another example, oxidation can be performed by creating in-situ ozone as an oxidizing agent. In another example, oxidation can be performed by utilizing a wet oxidation treatment, such as aqueous ozone or a peroxide mixture, e.g., hydrogen peroxide. A mixture of deionized water, aqueous ammonium hydroxide, and hydrogen peroxide, e.g., an SC-1 solution, can be used. In yet another example, oxidation can be performed using a plasma etch treatment, in which oxygen is used to oxidize the organics in the film while converting the aluminum to aluminum oxide. The plasma of this mechanism does not require oxygen as a constituent in the plasma-forming gas because PMMA contains atomic oxygen. Plasma systems capable of generating high density plasma with low damage, e.g., reduced energy, electron temperature, or bias power, can reduce damage to the substrate during oxidation.

Figure 2E:
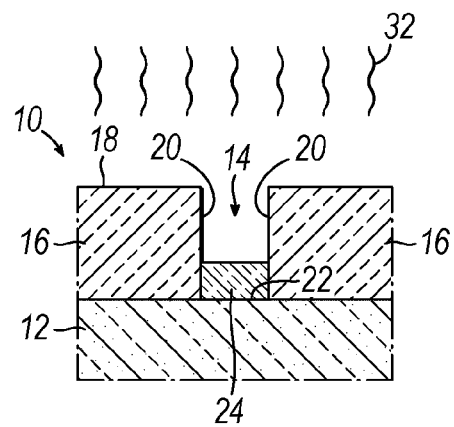

Following the oxidation in FIG. 2D, heat 32 can be applied in a high temperature bake process to remove any residual organic material, as shown in FIG. 2E.

The process flow is described above with reference to PMMA as the organic coating 26, but the invention is not so limited. In fact, there are many possible materials that can be chosen in place of PMMA. However, the material should possess at least one of the following traits: (i) solubility in an appropriate solvent for spin-coating or alternative coat mechanisms, such as inkjet; (ii) favorable gap-filling characteristics; (iii) removability through wet or dry means; and (iv) presence of a carbonyl functionality so that aluminum SIS can be achieved.

In alternative embodiments, a silylation mechanism may be used to convert the organic material into a dielectric material, as will be described below in reference to FIGS. 3A-3E.

Figure 3A:
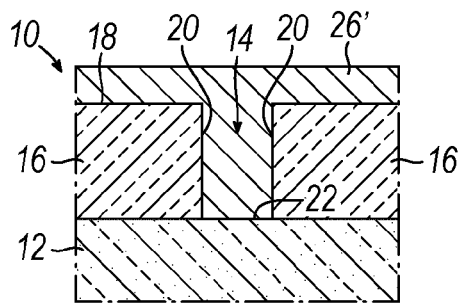
FIGS. 3A-3E illustrate an exemplary method according to another embodiment.
Figure 3B:
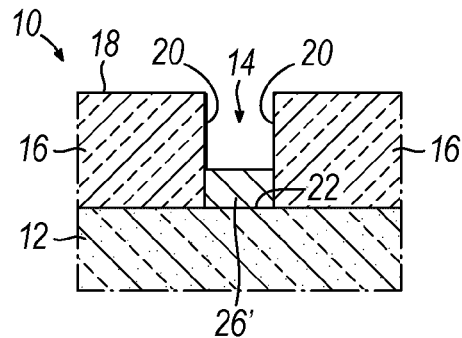

This sequence is similar to that above shown with the SIS process, but has some important differences. One representation of this approach is with a poly(hydroxystyrene) (PHOST) polymer as the organic coating material. This polymer contains a phenolic moiety that is readily silylatable. These polymers have also been used as BARC (bottom anti-reflective coatings), and possess favorable coating and gap filling properties as well. Following depositing an organic coating 26' of the PHOST material on the substrate 12, as shown in FIG. 3A, the PHOST material is readily etched back through the use of a standard developing solution, as shown in FIG. 3B. The developing solution can contain, for instance, tetramethylammonium hydroxide (TMAH), tetrabutylammonium hydroxide (TBAH), methyl isobutyl carbinol (MIBC), 2-heptanone, n-butyl acetate, isopropyl alcohol, anisole, propylene glycol monomethyl ether acetate (PGMEA), ethyl lactate, methyl amyl ketone, gamma-butyrolactone, propylene glycol monomethyl ether (PGME), methyl isobutyl ketone (MIBK), cyclohexanone, or combinations of two or more thereof. Such materials can be used when removing at least a portion of the organic material used to fill the open features, i.e., trench 14.

The wet developer may allow the PHOST material of organic coating 26' to be recessed within the trench 14. However, PHOST has a high development rate in standard developer, so it can be difficult to control such a process. One technique to provide greater control is to use a dilute developer (1/10th the concentration of standard developer) so that the material develops at a more manageable rate. Another approach would be to use a co-polymer that consists of PHOST and a protected-PHOST, which is poly (hydroxystyrene) with protecting groups attached to the pendant phenolic groups. Protecting groups can include tertbutoxycarbonyloxy (TBOC) or tetrahydropyran (THP), for example. The development of these copolymers in a developer, such as TMAH developer, can be controlled by the copolymer ratio of the various co-monomers, wherein the development rate slows as the proportion of PHOST in the copolymer lowers. Additionally, novolac polymers, i.e., phenol-formaldehyde resins, could also be used in place of PHOST. These polymers have the same chemical functionality, but have branched chains rather than linear chains, and can have lower development rates in such developers. Copolymers of PHOST and t-butyl acrylate (ESCAP), for example, may also be used to coat the substrate, and again, the development rate can be controlled by varying the copolymer ratio with the development rate slowing as the proportion of PHOST in the copolymer lowers. Such copolymers include regions that can undergo silylation, i.e., the PHOST portion, and SIS, i.e., the t-butyl acrylate portion. Other copolymers may be used for development rate control that include one polymer with functional groups that readily undergo silylation, while the other polymer contains carbonyl functional groups that undergo SIS, Further alternative materials that can be used as organic coating 26' include hydroxyl naphthyl polymers, which include hydroxyl groups bound to aromatic naphthyl groups and are expected to react similarly to the phenol groups of PHOST.

Figure 3C:
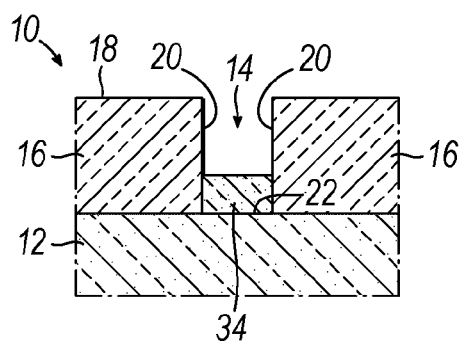

Once the PHOST material of the organic coating 26' has been recessed within the open feature, e.g., trench 14, the remaining PHOST material may be silylated with any of a number of silylating agents to give plug 34, as shown in FIG. 3C. Silylating agents may be secondary or tertiary amines that contain silicon in the groups attached to the amine. For example, possible silylating agents may include hexamethyldisilazane (HMDS), trimethylsilyldimethylamine (TMSDMA), dimethylsilyldimethylamine (DMSDMA), dimethyldisilyldimethylamine (DMDSDMA), and mixtures thereof. These agents may be administered in the gas phase. Alternatively, these agents can be administered in a liquid phase, e.g., agents used in the CARL Process (Chemical Amplification of Resist Lines). An exemplary liquid silylating agent is bisaminopropyl-oligodimethylsiloxane.

The phenolic group in the PHOST material of the organic coating 26' has a suitable chemical reactivity for silylation in reasonable times at relatively low temperatures. This phenolic group is of moderate acidity for an organic functionality ($pK_a$=9). Aliphatic alcohols can be silylated ($pK_a$=12), but can take a long time to do so, and carboxylic acids are more resistant to readily undergo silylation because their increased acidity ($pK_a$=5) forces the silylation reaction equilibrium to lie to the side of the unsilylated state. Accordingly, those skilled in the art will recognize that the $pK_a$ of the component that will undergo silylation in the filling material may vary. An exemplary range of the $pK_a$ is from about 7-10. Additionally, alcohols that have two trifluoro groups attached to the same carbon are readily silylatable at low temperatures and times because they have a $pK_a$ similar to phenol.

In the example given above, each phenolic site can undergo silylation, thereby incorporating a silicon atom at each phenolic site. Therefore, assuming complete silylation of a film, the number of silicon atoms that are incorporated into the film is equal to the number of phenolic sites in the film multiplied by the number of silicon atoms in the functional group attached to the amine. In subsequent steps, the atomic silicon may be used for converting the film to a silicon dioxide. Thus, it may be desirable to incorporate a large amount of silicon into the film. If 100% PHOST is used, each monomer unit has a phenolic site that can be silylated. If a copolymer containing protecting groups is used instead of pure PHOST, however, the protected co-monomer may require deprotection, which can be achieved thermally at temperatures above the thermal stability of the protecting group in question. Alternatively, a thermal acid generator (TAG) can be placed into the film to generate acid under the application of heat, and this acid can, in turn, remove the protecting group. Furthermore, another method for deprotecting the polymer would be to incorporate a photo-acid generator (PAG) into the material, expose the PAG to an appropriate wavelength of light, and bake the semiconductor device 10 to remove the protecting group.

If a copolymer of PHOST and t-butyl acrylate, for example, is used as the organic coating 26', a sequence of silylation and SIS, in either order, may be performed to give plug 34 with silicon atoms incorporated through silylation and aluminum atoms incorporated through SIS. More broadly speaking, if the copolymer contains a functionality having a $pK_a$ of about 7 to about 10 capable of undergoing silylation (but not SIS) and a carbonyl functionality capable of undergoing SIS (but not silylation), then both silicon atoms and aluminum atoms can be incorporated by performing silylation and performing SIS either before or after the silylation. If either co-monomer (or both) includes protecting groups, the co-monomer may be deprotected, as discussed above, prior to silylation and SIS, to remove the protecting groups.

Figure 3D:
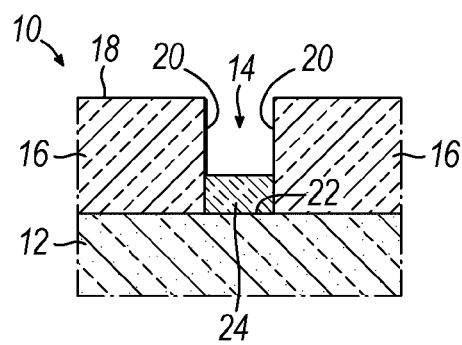
Figure 3E:
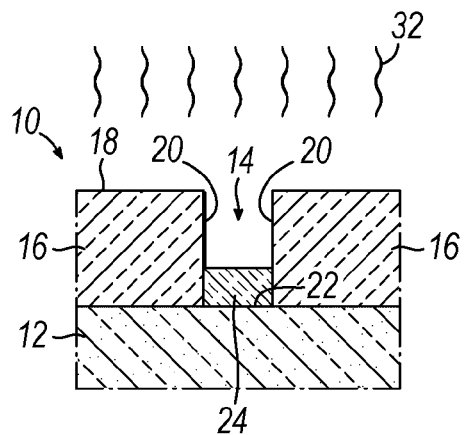

Once the silylation is complete, the incorporated silicon can be oxidized to create a silicon dioxide dielectric material as the dielectric plug 24 at the bottom 22 of the trench 14 as shown in FIG. 3D and heat 32 can be applied to remove any residual organic material, as shown in FIG. 3E. This can be accomplished through similar mechanisms as described above for the aluminum conversion. In one embodiment, the plasma treatment is especially advantageous. If both silicon and aluminum atoms are incorporated through a combination of silylation and SIS, then both are oxidized to create a silicon dioxide and aluminum oxide dielectric plug 24.

Another subtractive method involves the use of a spin-on-carbon (SOC) film, a type of amorphous carbon. SOC films possess favorable gap-fill properties and can be used to planarize topography.

Figure 4:
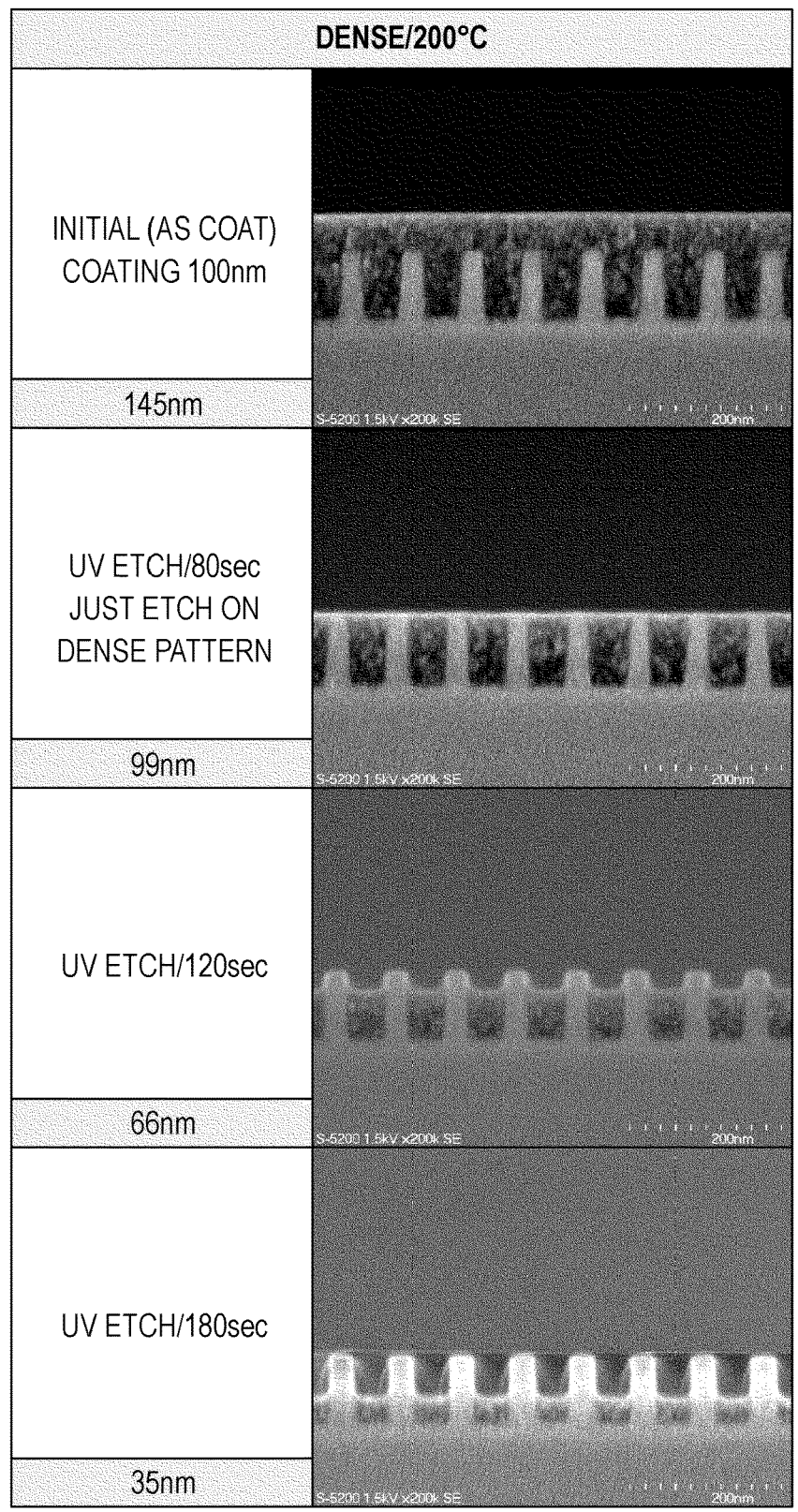
FIG. 4 provides exemplary data obtained in accordance with one embodiment.

FIG. 4 provides results for a UV-assisted etch back process on a substrate overfilled with an SOC. UV light at 172 nm in an ambient atmosphere is used to create ozone. The ozone can etch back the SOC film in fairly uniform fashion. FIG. 4 shows the impact of the UV exposure time. As shown in FIG. 4, the UV ozone process uniformly etches back the SOC film in a non-destructive fashion. Initially, the coating is 145 nm thick in and over trenches that are 100 nm deep. After 80 seconds of UV-etching, the coating is 99 nm thick and essentially fills the trenches to the top of the fins. After 120 seconds of UV-etching, the coating is 66 nm thick and now falls below the top edge of the fins. Finally, after 180 seconds of UV-etching, the coating is 35 nm thick and lines only the bottom of the trenches.

Figure 5A:
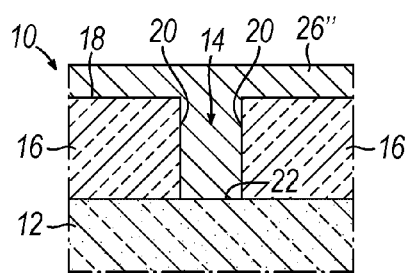
FIGS. 5A-5D illustrate an exemplary method according to another embodiment.
Figure 5B:
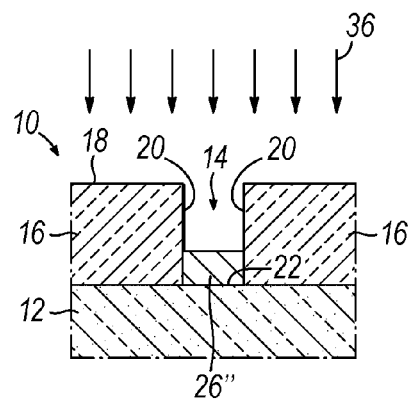
Figure 5C:
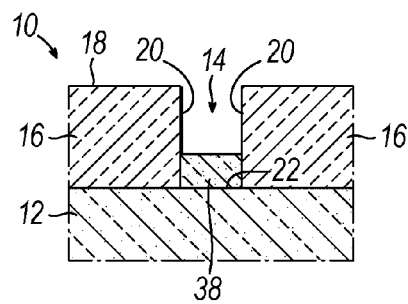
Figure 5D:
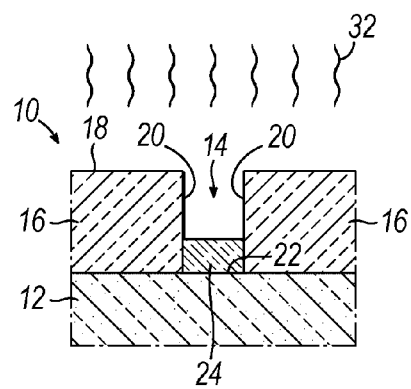

As shown in FIGS. 5A-5D, the overall process flow is similar to the process illustrated in FIGS. 2A-2E and 3A-3E, but the material that is applied in FIG. 5A as the organic coating 26" is the SOC film, and the UV ozone process 36 is used to etch back the film, as shown in FIG. 5B. To convert the SOC film of organic coating 26", a liquid infiltration process can be used to incorporate titanium atoms into the SOC film to give plug 38, as shown in FIG. 5C. This incorporation can be followed by oxidation of the titanium using one or more of a high thermal treatment, a dry ozone oxidation, a wet ozone oxidation, a wet process using ammonium hydroxide and peroxide, or a plasma process involving oxygen species to create a titanium oxide dielectric material as the dielectric plug 24, as shown in FIG. 5D. These oxidation methods are known and will not be discussed further.

Figure 6A:
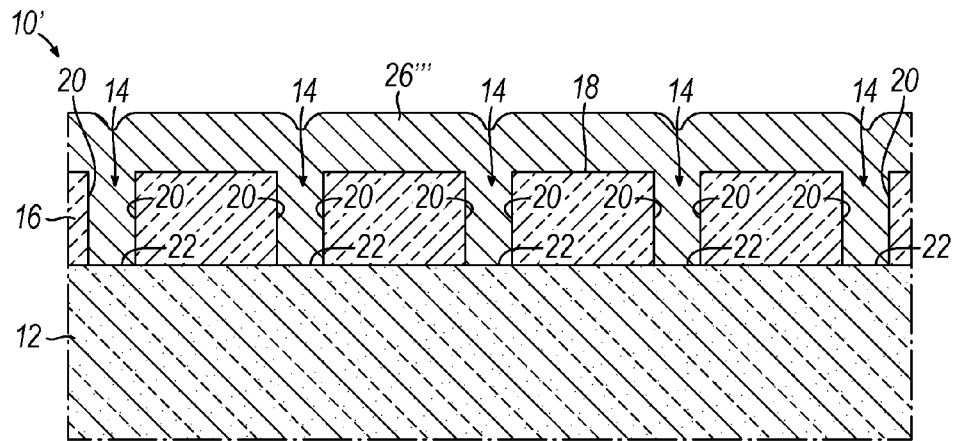
FIGS. 6A-6G illustrate an exemplary method according to yet another embodiment.

Yet another subtractive method for creating the plug is shown in FIGS. 6A-6G. In this embodiment, a photoactive film is used as the organic coating 26" to overfill the open features, e.g., trenches 14, as shown in FIG. 6A. In this example, a duty cycle of 3:1 is shown, but the invention is not so limited. An appropriate photoactive film will be both alterable by electromagnetic radiation and alterable upon contact with an acid rinse, as will be discussed further below. For instance, the photoactive film may include phenolic or acrylic moieties, among others.

Figure 6B:
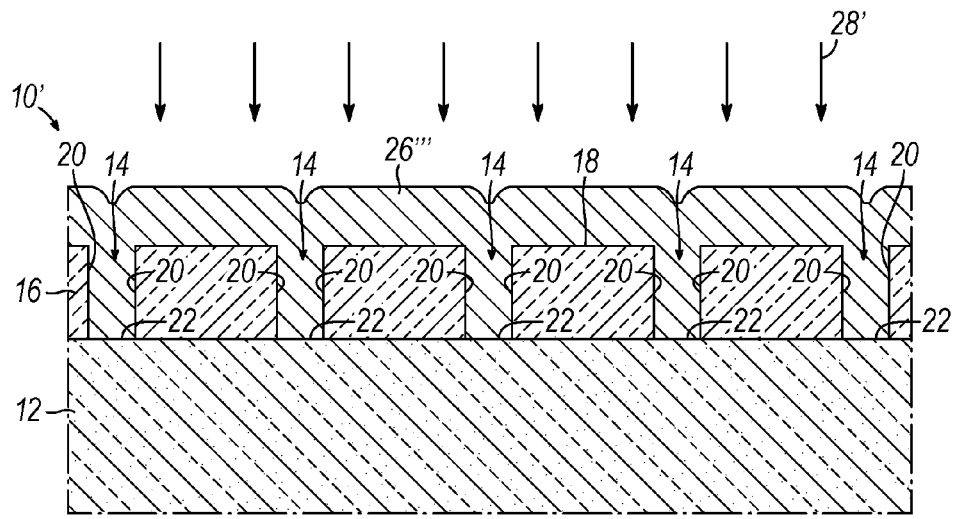
Figure 6C:
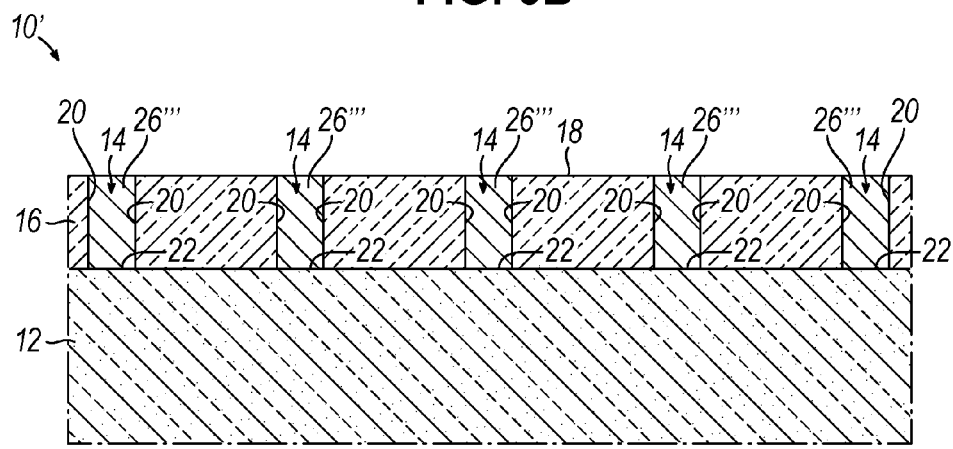

After overfilling with organic coating 26", and as shown in FIG. 6B, a flood exposure with electromagnetic radiation 28', e.g., UV radiation, is performed with a wavelength of light that is greater than 4 times the width W of the trenches (i.e., the quarter wavelength is greater than the width W). Light of wavelength $\lambda$ cannot penetrate openings with width W that is less than ¼ of $\lambda$. Accordingly, when a properly sized trench or pattern of trenches are filled or overfilled with a photoactive material, the portion of the photoactive materials within the trench may not be chemically altered by the exposure of light, e.g., may not be rendered dissolvable in the given wet developing chemistry. However, the photoactive material outside or over the trench may be chemically altered as a result of the light exposure, e.g., may be rendered dissolvable in the given wet developing chemistry. In this way, a portion of the photoactive material may be selectively altered, such that the altered and unaltered portions may respond in different ways to subsequent processing. Therefore, the light sensitive photoactive material in the trenches 14 may not be impacted, or have a reduced impact, when the semiconductor device 10' is exposed to electromagnetic radiation 28'. Thus, the photoacid that is in the unaltered portion of the photoactive material within the trenches 14 is not exposed to the flood exposure shown in FIG. 6B, and so the material within the trenches 14 remains non-acidic after the exposure. In other words, the unaltered portion of the photoactive material inside the trenches 14 (i.e., the fill portion) may retain the properties of an unexposed photoactive material, while the altered portion of the photoactive material outside of the trenches 14 (i.e., the overfill portion) may have the properties of an exposed photoactive material. As shown in FIG. 6C, a wet development process may then be performed to remove the altered overfill portion of the organic coating 26''' that was exposed to the flood exposure. The organic coating 26''' remaining in the trenches 14 and the upper surface 18 of material layer 16 form a planarized surface.

Figure 6D:
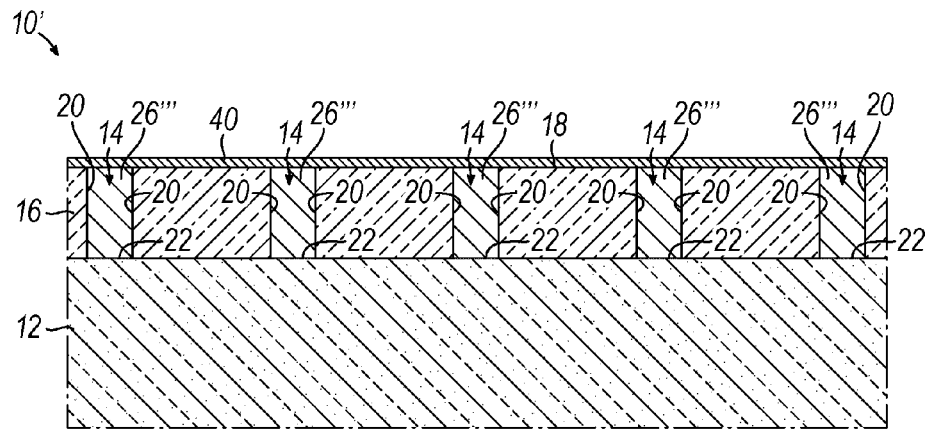

Next, as shown in FIG. 6D, semiconductor device 10' is coated with acid rinse 40. Alternatively, although not shown, a feeder film containing acid (akin to a topcoat with acid) could be coated on top of the structure. If this feeder film is used, then the feeder film can be selected to be soluble in the solvent that will complete the development of the photoactive material in the last step of the process.

Figure 6E:
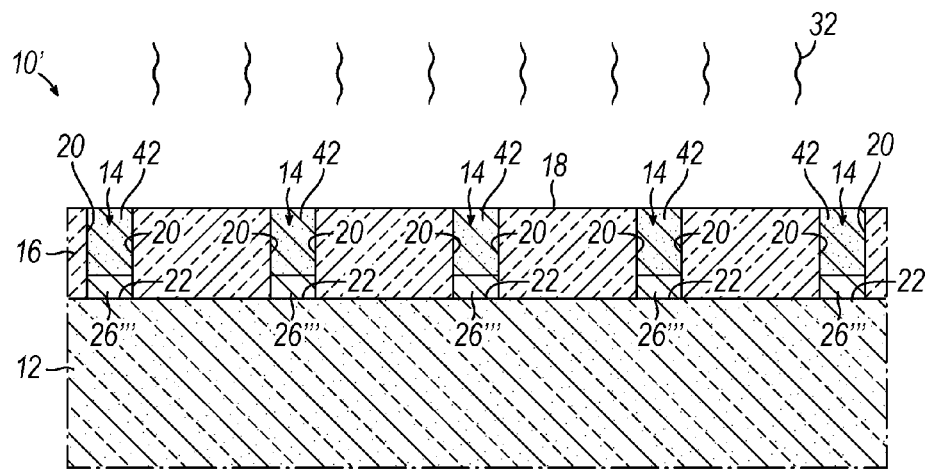

After the acid rinse, a timed diffusion bake is performed to give a deprotected film 42, as shown in FIG. 6E. The bake drives the acid down into the film and causes deprotection of the photoactive material. As noted above, the photoacid that was in the trench 14 originally was not exposed, and so it is still non-acidic at this point in the process. Thus, the depth of deprotection within the trench is controlled by the length of time and/or the temperature of the diffusion bake. As the time period gets longer and/or the temperature increases, more acid can penetrate within the film. For example, an exemplary temperature for the diffusion bake is 70-200° C. The penetration can also be controlled by the amount of acid deposited during the acid rinse step. Thus, the penetration may be controlled by the acid concentration in the rinse itself.

Figure 6F:
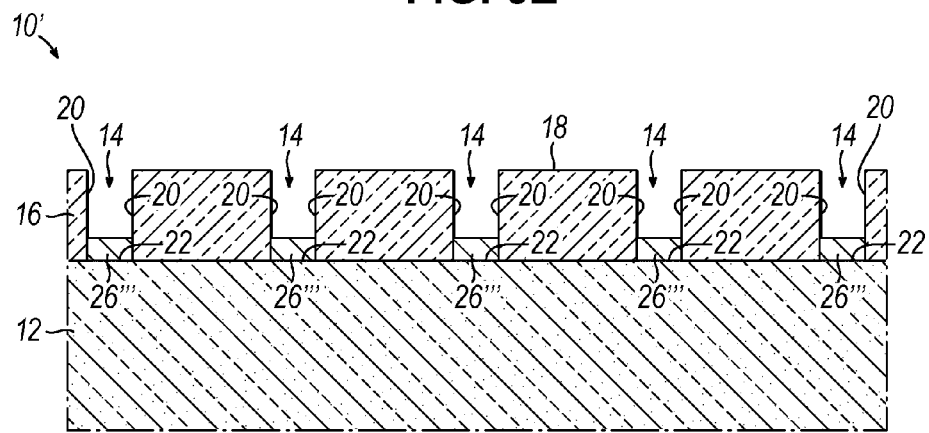
Figure 6G:
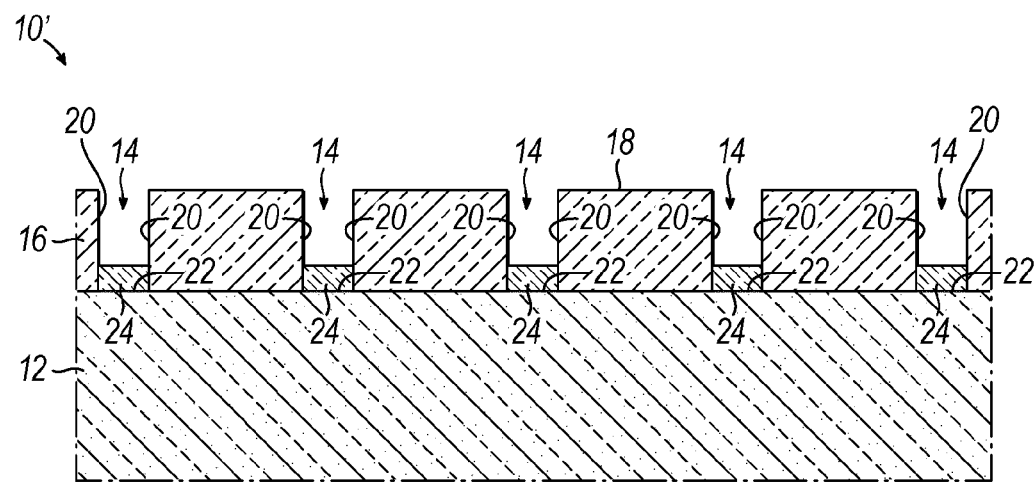

Thereafter, a timed develop step enables the removal of the deprotected film 42 to a set depth, as shown in FIG. 6F, leaving a small amount of the photoactive material of organic coating 26''' at the bottom 22 of the trench 14. As shown in FIG. 6G, an infiltration method can be performed thereafter to introduce a desired atomic species to convert the remaining organic coating 26''' to a dielectric material for the dielectric plug 24. The atomic species may in part depend on the nature of the photoactive film that was originally coated.

Following this process sequence eliminates potential issues that may arise from non-uniformity of the photoactive film as the organic coating 26'''. Considering an array that consists of trenches 14 of the same size as those shown in FIG. 6A, but on a 5:1 duty cycle (not shown), the photoactive film will overfill these trenches more than the denser trenches 14 shown in FIG. 6A. The flood exposure, then, allows the film heights across the different trench densities to be equalized or planarized. The trenches 14 act to filter the light so that adequate exposure can be used to remove the excess film from the less dense array of trenches without impacting the more dense trenches. When the overfilled portion of the photoactive film of organic coating 26''' is removed, as shown in FIG. 6C, the photoactive film may be discontinuous throughout the material layer 16. Further, the upper surface 18 and the photoactive film may form a continuous surface, as depicted in FIG. 6C.

In one example, the photoactive film used for organic coating 26''' can be a copolymer of t-butyl acrylate and methylmethacrylate formulated with 3% triphenylsulfonium nonaflate photoacid generator. The t-butyl group on the acrylate co-monomer is acid labile. After coating and flood exposure, the t-butyl group in the overfill portion will be deprotected or cleaved, and the film can be developed in standard TMAH developer. Next, an acid rinse 40 consisting of nonaflatic acid in appropriate solvent is applied to the material. The film is baked to diffuse the acid into the trench where additional deprotection occurs to the desired depth, and the deprotected film 42 within the trench can then be removed with developer. The timed diffusion bake controls the depth of penetration of the acid and the subsequent height of material remaining, i.e., a t-butyl acrylate/methylmethacrylate plug.

Following the creation of this t-butyl acrylate/methylmethacrylate plug, the remaining t-butyl groups are thermally cleaved in a deprotection bake (not shown). Thus, both co-monomers of the block copolymer may undergo aluminum SIS. After infiltration, the oxidation methods described above may be used to create an aluminum oxide plug as the dielectric plug 24.

Although only certain embodiments of this invention have been described in detail above, those skilled in the art will readily appreciate that many modifications are possible in the embodiments without materially departing from the novel teachings and advantages of this invention. For instance, the concepts contained herein apply not only to trenches in semiconductor devices but also to vias/holes. Accordingly, all such modifications are intended to be included within the scope of this invention.

The invention claimed is:

1. A method for partially filling an open feature on a substrate, comprising:
   receiving a substrate having a layer with at least one open feature formed therein, the open feature penetrating into the layer from an upper surface and including sidewalls extending to a bottom of the open feature;
   over-filling the open feature with an organic coating that covers the upper surface of the layer and extends to the bottom of the open feature;
   removing a portion of the organic coating to expose the upper surface of the layer and recessing the organic coating to a pre-determined depth from the upper surface to create an organic coating plug of pre-determined thickness at the bottom of the open feature; and
   converting the chemical composition of the organic coating plug to create an inorganic plug,
   wherein the organic coating includes a polymeric material or co-polymeric material containing a carbonyl functionality, and
   wherein removing the portion of the organic coating includes performing a wet etch process comprising:
      exposing the organic coating to ultraviolet (UV) radiation to increase the solubility of the as-formed organic coating in a developing solution; and
      controllably etching the organic coating to the pre-determined depth by exposing the organic coating to the developing solution.

2. The method of claim 1, wherein converting the chemical composition of the organic coating plug includes performing a metal infiltration synthesis process and then performing an oxidation process.

3. The method of claim 1, wherein converting the chemical composition of the organic coating plug includes exposing the organic coating plug to trimethylaluminum (TMA) and then an oxygen environment to create an inorganic plug composed of an aluminum oxide dielectric material.

4. The method of claim 1, wherein the UV radiation exposure is conducted at a UV wavelength ranging from approximately 170 nm to approximately 180 nm.

5. The method of claim 1, wherein the UV radiation exposure is conducted at a UV wavelength having a quarter wavelength less than or equal to an opening dimension of the open feature, measured as the distance between the sidewalls of the open feature.

6. The method of claim 1, wherein the organic coating contains a dye of a concentration selected to increase the penetration of the UV radiation into the open feature.

7. The method of claim 1, wherein the developing solution contains tetramethylammonium hydroxide (TMAH), tetrabutylammonium hydroxide (TBAH), methyl isobutyl carbinol (MIBC), 2-heptanone, n-butyl acetate, isopropyl alcohol, anisole, propylene glycol monomethyl ether acetate (PGMEA), ethyl lactate, methyl amyl ketone, gamma butyrolactone, propylene glycol monomethyl ether (PGME), methyl isobutyl ketone (MIBK), or cyclohexanone, or combinations of two or more thereof.

8. The method of claim 1, wherein the polymeric material further includes a functionality having a pKa of about 7 to about 10.

9. The method of claim 8, wherein the polymeric material includes poly(hydroxystyrene) (PHOST) and optionally a protected PHOST.

10. The method of claim 9, wherein the protected PHOST contains a protecting group selected from the group consisting of tert-butoxycarbonyl (TBOC) or tetrahydropyran (THP).

11. The method of claim 10, wherein converting the chemical composition of the organic coating plug includes deprotecting the organic coating plug, performing a silylation process, performing an oxidation process, and removing residual carbon from the inorganic plug.

12. The method of claim 11, wherein performing the silylation process includes exposing the organic coating plug to a silylating agent selected from the group consisting of hexamethyldisilazane (HMDS), trimethyl silyldimethylamine (TMSDMA), dimethylsilyldimethylamine (DMSDMA), dimethyldisilyldimethylamine (DMDSDMA), and bisaminopropyl-oligodimethylsiloxane.

13. The method of claim 8, wherein, converting the chemical composition of the organic coating plug includes performing a silylation process and a metal infiltration synthesis process in either order, performing an oxidation process, and removing residual carbon from the inorganic plug.

14. The method of claim 13, wherein the polymeric material is a copolymer of poly(hydroxystyrene) (PHOST) and t-butyl acrylate.

15. A method for partially filling an open feature on a substrate, comprising:
   receiving a substrate having a layer with at least one open feature formed therein, the open feature penetrating into the layer from an upper surface and including sidewalls extending to a bottom of the open feature;
   over-filling the open feature with an organic coating that covers the upper surface of the layer and extends to the bottom of the open feature;
   removing a portion of the organic coating to expose the upper surface of the layer and recessing the organic coating to a pre-determined depth from the upper surface to create an organic coating plug of pre-determined thickness at the bottom of the open feature; and
   converting the chemical composition of the organic coating plug to create an inorganic plug,
   wherein the organic coating includes a photo-active material, and wherein removing the portion of the organic coating includes planarizing the organic coating with the upper surface of the layer, de-protecting the organic coating to the pre-determined depth within the open feature, and removing the de-protected organic coating.

16. The method of claim 15, wherein planarizing the organic coating includes:
   exposing the organic coating to ultraviolet (UV) radiation; and thereafter, exposing the organic coating to a developing solution to remove the exposed portion of the organic coating, the UV radiation exposure being a flood exposure conducted at a UV wavelength having a quarter wavelength greater than an opening dimension of the open feature, measured as the distance between the sidewalls of the open feature.

17. The method of claim 15, wherein de-protecting the organic coating to the pre-determined depth includes:
   exposing the organic coating to an acid solution; and
   diffusing acid through the organic coating to the pre-determined depth of the organic coating in the open feature.

* * * * *